United States Patent [19]

Wakabayashi et al.

[11] Patent Number: 5,764,666
[45] Date of Patent: Jun. 9, 1998

[54] DEVICE FOR DETECTING MALFUNCTIONS IN LASER DEVICES

[75] Inventors: Osamu Wakabayashi; Noritoshi Ito, both of Hiratsuka, Japan

[73] Assignee: Kabushiki Kaisha Komatsu Seisakusho, Tokyo, Japan

[21] Appl. No.: 568,643

[22] Filed: Dec. 7, 1995

[30] Foreign Application Priority Data

Dec. 8, 1994 [JP] Japan ................... 6-304980

[51] Int. Cl.⁶ ................................................. H01S 3/10
[52] U.S. Cl. ................................................. 372/38; 372/29
[58] Field of Search ..................... 372/9, 25, 29, 372/31–33, 38, 109

[56] References Cited

U.S. PATENT DOCUMENTS

| | | | |
|---|---|---|---|
| 4,819,242 | 4/1989 | Kaku et al. | 372/38 |
| 4,977,565 | 12/1990 | Shimosaka | 372/32 |
| 5,177,756 | 1/1993 | Rockstroh et al. | 372/38 |
| 5,243,616 | 9/1993 | Hviid et al. | 372/38 |

FOREIGN PATENT DOCUMENTS 63-300212   12/1988   Japan .

*Primary Examiner*—John D. Lee
*Attorney, Agent, or Firm*—Varndell Legal Group

[57] ABSTRACT

A malfunction signal indicating that a laser device is malfunctioning is output from a misfire detector when the oscillation of a laser beam is detected by a laser oscillation detector in an event that no laser oscillation command is detected by a laser oscillation command detector. Another malfunction signal indicating that the laser device is malfunctioning is output from the malfunction detector when no oscillation of a laser beam is detected by the laser oscillation detector at a prescribed time after a laser oscillation command has been detected by the laser oscillation command detector. The troubled part (thyratron or charging circuit) in the laser device is located based on the detection results of the malfunction detector.

4 Claims, 10 Drawing Sheets

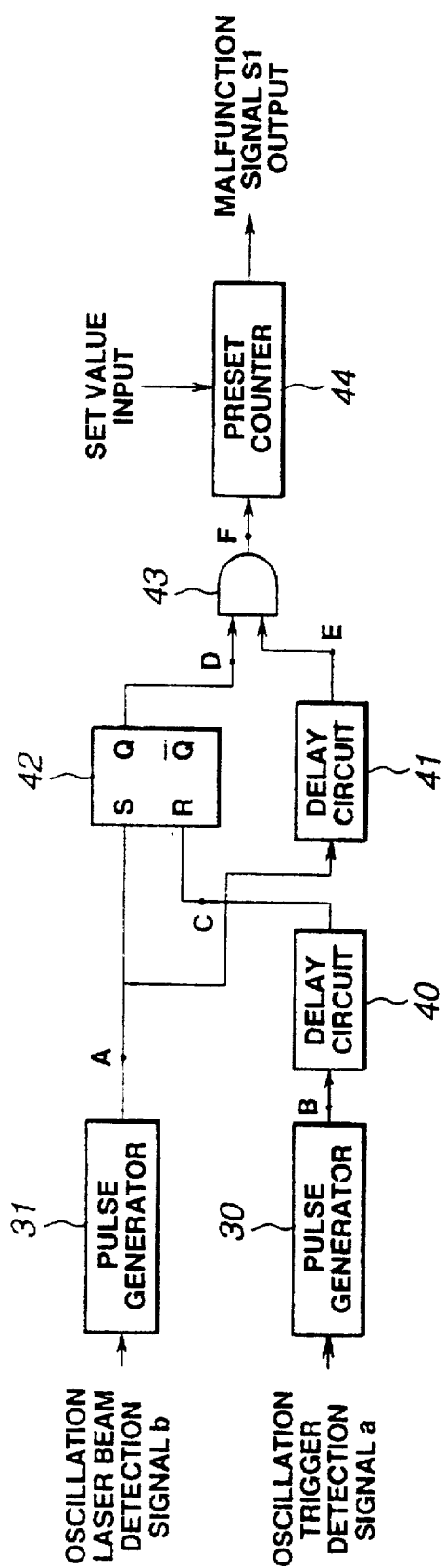
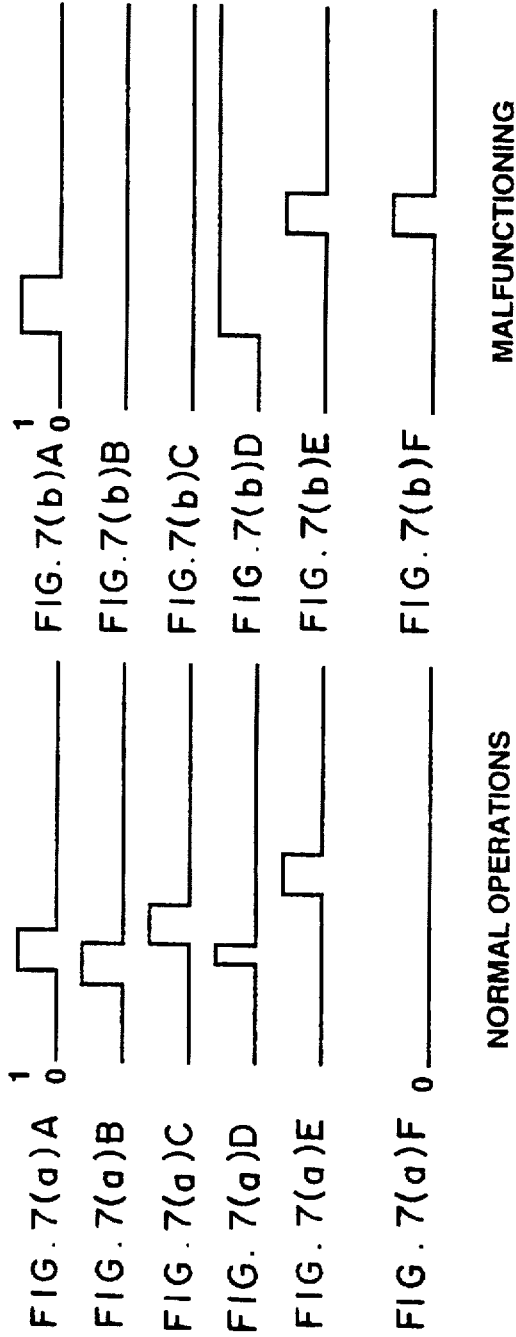
FIG.6
FIG.7(a) / FIG.7(b)

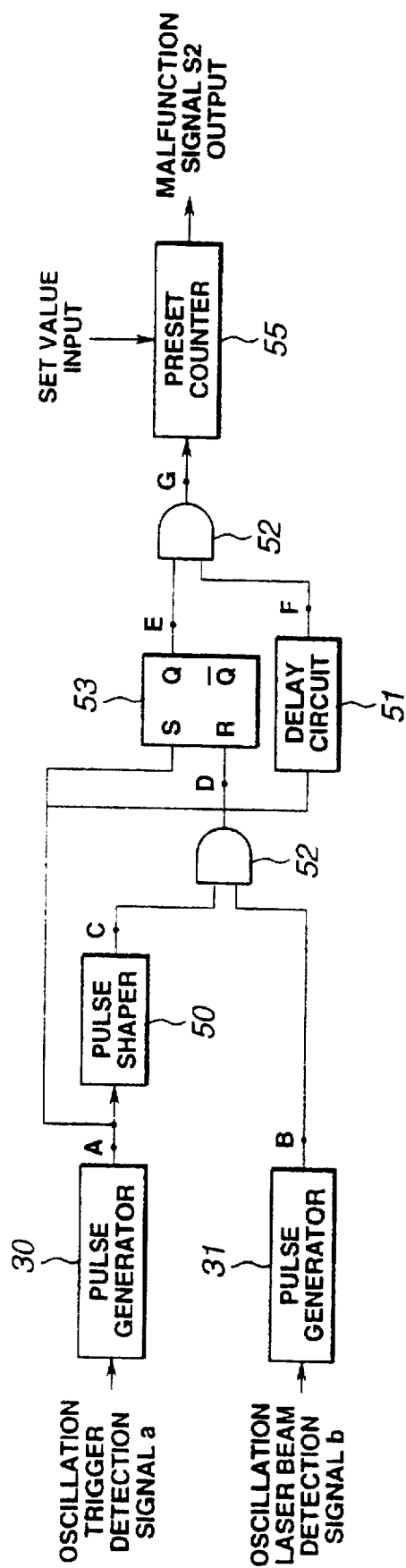
FIG.9
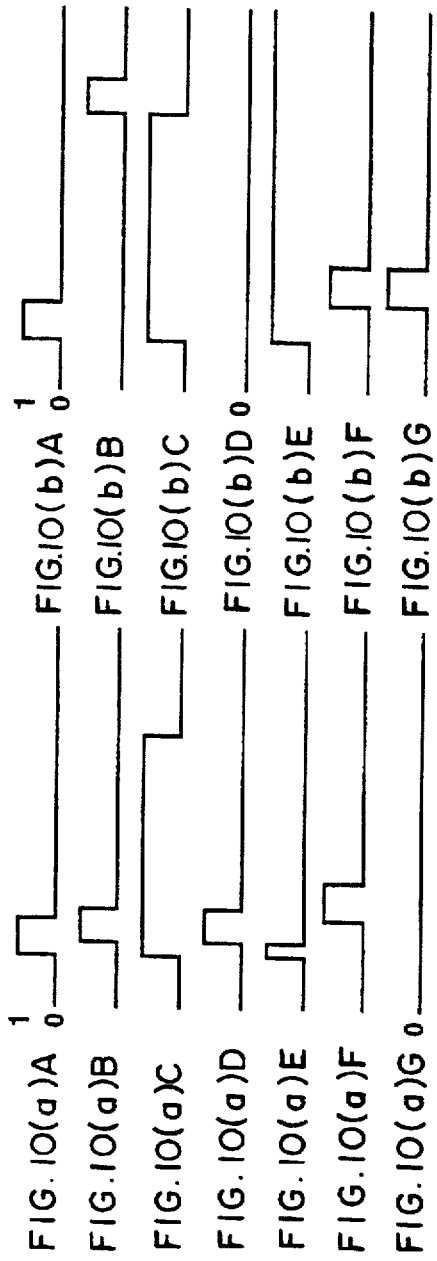

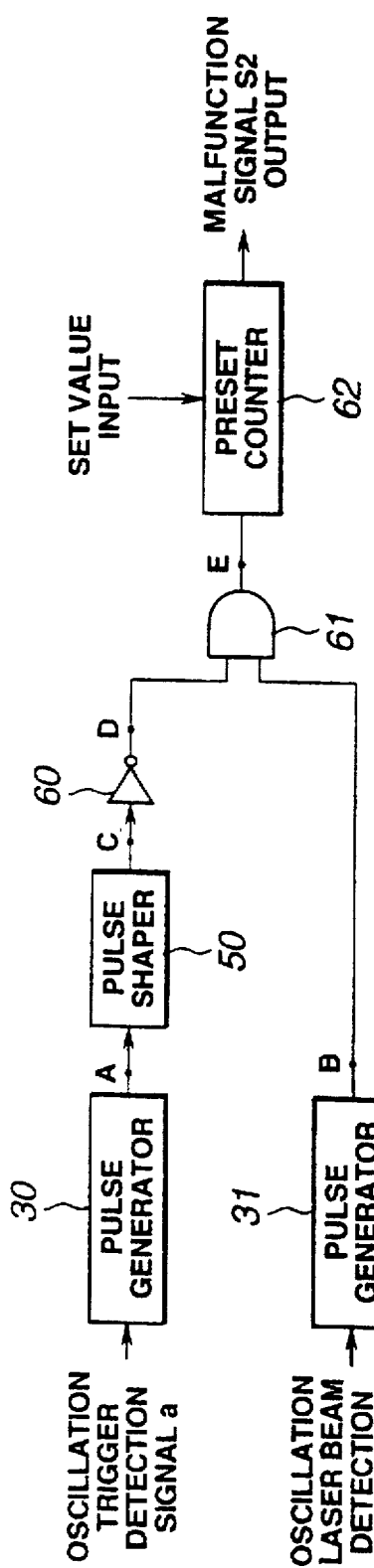
FIG.11
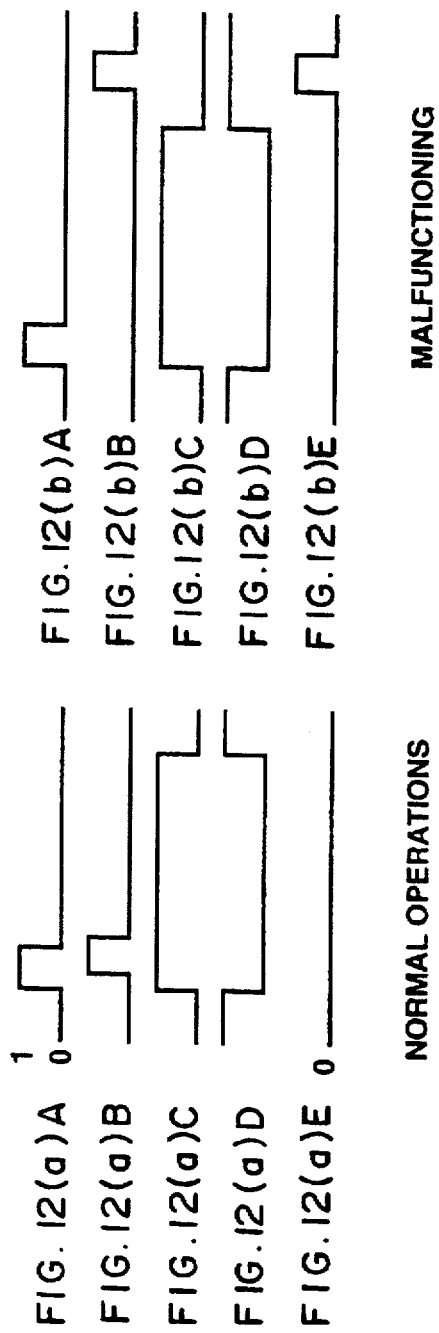

DEVICE FOR DETECTING MALFUNCTIONS IN LASER DEVICES

BACKGROUND OF THE INVENTION

1. Field of the Invention

The present invention relates to a device for detecting malfunctions in laser devices such as excimer lasers, and more particularly to a device for detecting malfunctions of failing to oscillate a laser beam in accordance with a command from an exposure device such as a semiconductor exposure device or a processing unit which uses a laser as a light source so as to allow the production of defective products to be forestalled.

2. Description of the Prior Art

Light exposure is effected by means of what is referred to as the step-and-repeat method (stepper method) in conventional exposure devices involving the use of an excimer laser as the light source.

In this stepper method, the position of a stage with respect to a reticle and projection lens is determined, and light exposure is then effected while the reticle and the stage are stopped. The laser pulse energy is totaled, and when the prescribed total of the quantity of light is reached, the laser oscillation is stopped and the stage is moved. This is repeated to control the quantity of light exposure.

The total quantity of light exposure is monitored, and since the light exposure is effected based on the monitoring results, the quantity of light can be controlled with a high level of precision in this exposure method, even in the event of slight irregularities in the repeating frequency and laser pulse energy or misfiring (oscillation in the absence of any oscillation command or oscillation failure despite presence of oscillation command).

This method is based on an approach that even when the individual pulse energy levels are irregular, the irregularities conform to a fixed distribution such as a normal distribution, and therefore, when a large number of pulse beams is totaled, the total quantity of light varies in extremely low levels.

In the event of frequent misfiring, however, not even the stepper method allows the quantity of light to be controlled.

The applicants have proposed a technology of shutting down laser devices in emergencies so as to avoid danger of producing defective products due to irregularities of the amount of exposure when misfiring is generated in lasers, and this technology has been submitted to the Japanese Patent Office for patent (Japanese Patent Application No. 4-268810).

In the technique disclosed for the laser device in this application, which oscillates one pulse every time a laser oscillation command is produced, the number of times a laser beam is detected is compared with the number of laser oscillation commands, and when the number of times that no laser beam is oscillated even though a laser oscillation command has been generated is greater than a set value, the laser device is shut down as an emergency measure.

This laser shut down control makes it possible to avoid producing semiconductors of increasingly defective quality resulting from irregularities in the total quantity of light exposure.

The stepper method is not the only light exposure method. Another method is a method referred to as the scan method. The scan method is well known from *Nikkei Microdevices*, September issue, 1993 (pp. 54–59), for example.

In the scan method, the light is adjusted to the shape of a sheet beam, and the reticle and wafer are exposed to light as they are moved (scanned).

An advantage of the scan method is that a large surface area can be exposed. When a lens having a field size of 36 mm $\phi$ is used, for example, the angle is 25 mm (one 256 MDRAM 15×25 mm chip) in the stepper method, whereas light exposure with a large area of 30×40 mm (two 256 MDRAM 15×25 mm chips) is possible in the scan method. Chip size will increase in the future as the degree of integration increases (for example, about 10×20 mm with 64 MDRAM, and about 15×25 mm with 256 MDRAM). Reasons behind the shift to the scan method include higher through-put, technical limits on the manufacture of lenses for reduction projection light devices, greater surface area accompanying higher integration, and the like.

A disadvantage of the scan method, on the other hand, is that the quantity of light is in principle extremely difficult to control.

That is, excimer lasers are pulse lasers, and light exposure must therefore be effected in the scan method by the highly precise synchronization of laser oscillation with reticle and waver stage movement.

In this case, just as in the stepper method, feed back control is not possible for the total quantity of light exposure when light exposure is effected based on the results of the detection of the total quantity of light exposure.

To therefore control the exposure dosage with a high level of precision, oscillation must occur immediately (or within an extremely short permissible time) following input of a laser oscillation command (external trigger) to the laser device, and there must be essentially very little irregularity in the individual laser energy. In the case of the scan method, in particular, misfiring is absolutely not permitted.

Thus, when misfiring is produced or laser oscillation cannot be synchronized in the scan method, immediate detection is necessary to shut down the laser in an emergency, and the exposure device must be notified of the malfunction.

SUMMARY OF THE INVENTION

A first object of the present invention is to provide a device for detecting in advance malfunctions that are problems in the scan method so as to allow the production of defective products to be forestalled.

A second object of the present invention is to provide a device that allows the location of trouble in a laser device to be rapidly specified.

To achieve the first object, the first aspect of the present inventions thus comprises providing a laser device in which a laser beam is oscillated in response to a laser oscillation command with laser oscillation command detection means for detecting laser oscillation commands, laser oscillation detection means for detecting the presence or absence of oscillation of a laser beam and means for outputting a malfunction signal indicating that the laser device is malfunctioning in the event that a laser beam oscillation is detected by the laser oscillation detection means when no laser oscillation command has been detected by the laser oscillation command detection means.

To achieve the first object, the second aspect of the present inventions comprises the same laser oscillation command detection means and laser oscillation detection means as well as means for outputting a malfunction signal indicating that a laser device is malfunctioning when no laser beam oscillation is detected by the laser oscillation detection means at a prescribed point in time after a laser oscillation command has been detected by the laser oscillation command detection means.

To achieve the second object, the third aspect of the present inventions comprises the same laser oscillation command detection means and laser oscillation detection means, as well as first means for outputting a first malfunction signal indicating that the laser device is malfunctioning in the event that a laser beam oscillation is detected by the laser oscillation detection means when no laser oscillation command has been detected by the laser oscillation command detection means, second means for outputting a second malfunction signal indicating that a laser device is malfunctioning when no laser beam oscillation is detected by the laser oscillation detection means at a prescribed point in time after a laser oscillation command has been detected by the laser oscillation command detection means, and trouble location determination means for determining the location of trouble in the laser device based on the detection results of the first and second malfunction detection means.

According to the structure of the first aspect of the present invention, as shown in FIGS. 1 and 3, a malfunction signal S1 indicating that the laser device is malfunctioning is output when no laser oscillation command a is detected by a laser oscillation command detection means (oscillation trigger detector) 10 and when the oscillation b of a laser beam L is detected by a laser oscillation detection means 11.

According to the structure of the second aspect of the present invention, as shown in FIGS. 1 and 3, a malfunction signal S2 indicating that the laser device is malfunctioning is also output when no oscillation b of a laser beam L is detected by the laser oscillation detection means 11 at a prescribed point in time after a laser oscillation command a has been detected by the laser oscillation command detection means 10.

According to the structure of the third aspect of the present invention, as shown in FIG. 14, the location of the trouble (thyratron or charging circuit) in the laser device is also determined based on the detection results S1 and S2 of the first and second malfunction detection means (step 401).

BRIEF DESCRIPTION OF THE DRAWINGS

FIG. 6 is a block diagram illustrating the concrete structure of the malfunction S1 detection device depicted in FIG. 3;

FIGS. 7(a)A to 7(b)F are timing charts of the signals for he device components depicted in FIG. 6 in which FIG. 7(a)A to FIG. 7(a)F is a timing chart when operations are normal, and FIG. 7(b)A to FIG. (b)F is a timing chart when operations are malfunctioning;

FIG. 9 is a block diagram illustrating the concrete structure of the malfunction S2 detection means depicted in FIG. 3;

FIGS. 10(a)A to 10(b)G are timing charts of the signals for the device components depicted in FIG. 9 in which FIG. 10(a)A to FIG. 10(a)G is a timing chart when operations are normal, and FIG. 10(b)A to FIG. 10(b)G is a timing chart when operations are malfunctioning;

FIG. 11 is a block diagram illustrating the concrete structure of the malfunction S2 detection means depicted in FIG. 3;

FIG. 12(a)A to 12(b)E are timing charts of the signals for the device components depicted in FIG. 11 in which FIG. 12(a)A to FIG. 12(a)E is a timing chart for wh rations are normal, and FIG. 12(b)A to FIG. 12(b)E is a timing chart for when operations are malfunctioning;

DETAILED DESCRIPTION OF THE PREFERRED EMBODIMENTS

Preferred embodiments of the device for detecting malfunctions in laser devices pertaining to the present invention are described below with reference to the figures.

Figure 1:
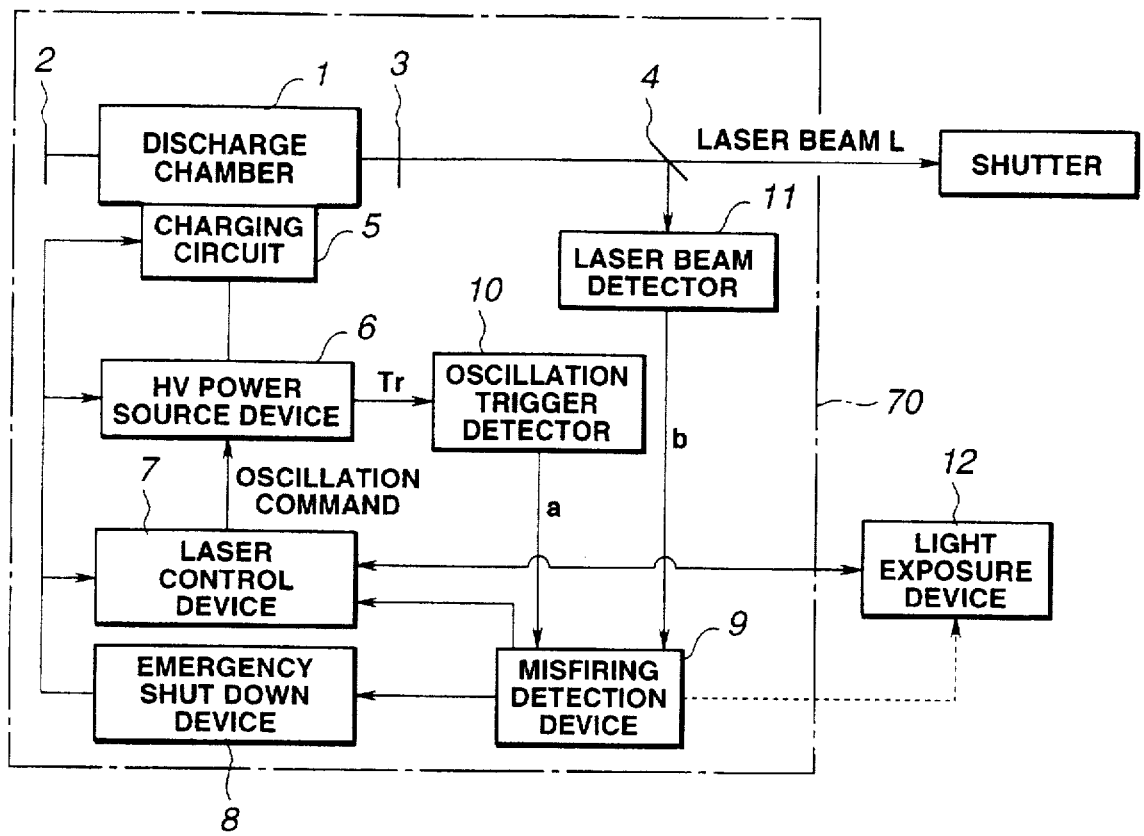
FIG. 1 is a block diagram illustrating the structure of an embodiment of the device for detecting malfunctions in laser devices pertaining to the present invention.
Figure 2:
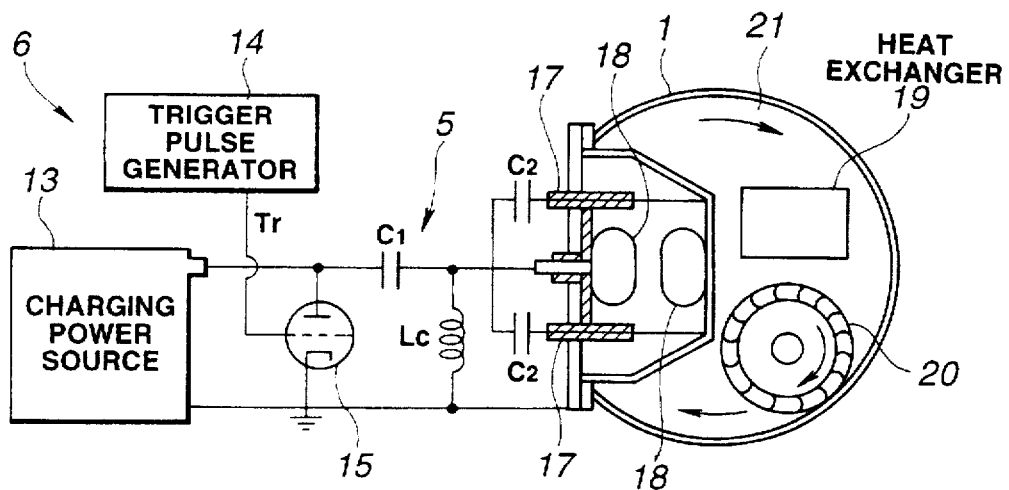
FIG. 2 is a circuit diagram illustrating the structure of the discharge chamber, charging circuit, and HV power source device depicted in FIG. 1.

FIG. 1 illustrates an embodiment of a laser device 70 and a light exposure device 12 on the outside of this laser device 70, in which light exposure is effected with a laser beam L produced by the laser device 70. FIG. 2 is a circuit diagram illustrating the concrete structure of the discharge chamber 1, charging circuit 5, and HV power source device 6 depicted in FIG. 1. An excimer laser is assumed in this embodiment.

As shown in the figures, a laser gas 21 such as a halogen gas and a rare gas is sealed in the discharge chamber 1 of the laser device 70. A heat exchanger 19 and fan 20 are provided. Pre-ionizing electrodes 17 and 17 for preionization, and main discharge electrodes 18 for main discharge are provided in the discharge chamber 1.

The charging circuit 5 comprises a main discharge capacitor C1, pre-ionizing capacitors C2 and C2, a coil Lc, and a switching element thyratron 15. The HV power source device 6 comprises a charging power source 13 and a trigger pulse generator 14 that generates a trigger pulse signal Tr.

A laser control device 7 is a control unit for controlling the laser device 70. An emergency shut down device 8 is used to shut down the entire laser device 70 in emergencies when a malfunction in the laser device 70 has been detected.

A misfiring detection device 9 detects laser beam misfiring, which is communicated to the laser control device 7 or the light exposure device 12.

A oscillation trigger detector 10 detects the trigger pulse signal (oscillation trigger) Tr output and outputs a oscillation trigger detection signal a.

A laser beam detector 11 detects whether or not a laser beam L has actually been oscillated in the discharge chamber 1 and, when a laser beam L has been oscillated, outputs a oscillation laser beam detection signal b to that effect.

An optical resonator is constructed of a total reflecting mirror 2 and a partial reflecting mirror 3. Resonating light from the optical resonator is partially sampled by a beam splitter 4 and is input to the laser beam detector 11. The oscillated laser beam L is supplied to the light exposure device 12.

The following actions are taken for each pulse during laser oscillation.

That is, a oscillation command is first output from the laser control unit 7 to the HV power source device 6. High voltage HV is then supplied by the charging power source 13 of the HV power source device 6 to the charging circuit 5. A charge for bringing about discharge between the electrodes 17 and 18 in the discharge chamber 1 thus accumulates in the capacitors C1 and C2 respectively, and charging is effected.

When charging has thus been completed and a trigger pulse signal Tr is output from the trigger pulse generator 14 to the thyratron 15, the thyratron 15 is actuated, and the thyratron 15 becomes conductive. As a result, the charge in the capacitor C1 is discharged and is used for main discharge. When main discharge is effected between the main discharge electrodes 18, the laser gas 21 is excited and emits light. The emitted light is thus oscillated and output in the form of laser light L through the resonator.

A oscillation trigger detection signal a is output by the oscillation trigger detector 10 to the misfiring detection device 9 each time the trigger pulse signal Tr is detected. A oscillation laser beam detection signal b is meanwhile output by the laser beam detector 11 to the misfiring detection device 9 each time an input oscillation laser beam L is detected.

Based on the oscillation trigger detection signal a and the oscillation laser beam detection signal b, the misfiring detection device 9 detects misfiring, that is, a malfunction, in the laser device 70. Here, the misfiring detection device 9 determines to which device the malfunction detection signal S1 or S2 should be output.

When it is determined that the laser device 70 must be shut down in an emergency, a malfunction detection signal S1 or S2 is output to the emergency shut down device 8.

When a malfunction detection signal S1 or S2 is input to the emergency shut down device 8, this device 8 outputs an emergency shut down command to the charging circuit 5, HV power source device 6, and laser control device 7 for an emergency shut down of the entire operation of the laser device 70. The devices shut down operations according to the emergency shut down command, and the entire operation of the laser device 70 comes to a halt.

When it is determined that no emergency shut down is necessary, the malfunction detection signal S1 or S2 is output to the laser control device 7. As a result, the light exposure device 12 is notified by the laser control device 7 of the fact that a misfire (malfunction) has occurred.

When the light exposure device 12 must be notified of the fact that a misfire (malfunction) has occurred, the malfunction detection signal S1 or S2 may be sent directly from the misfiring detection device 9 to the light exposure device 12, as shown by the broken line in FIG. 1.

In this embodiment, the trigger pulse signal Tr is detected by attaching the oscillation trigger detector 10 to the HV power source device 6 (trigger pulse generator 14), but this is not the only option. It can be mounted in any location where the laser oscillation command can be detected. For example, the oscillation trigger detector 10 may be mounted between the HV power source device 6 and the laser control device 7.

Figure 3:
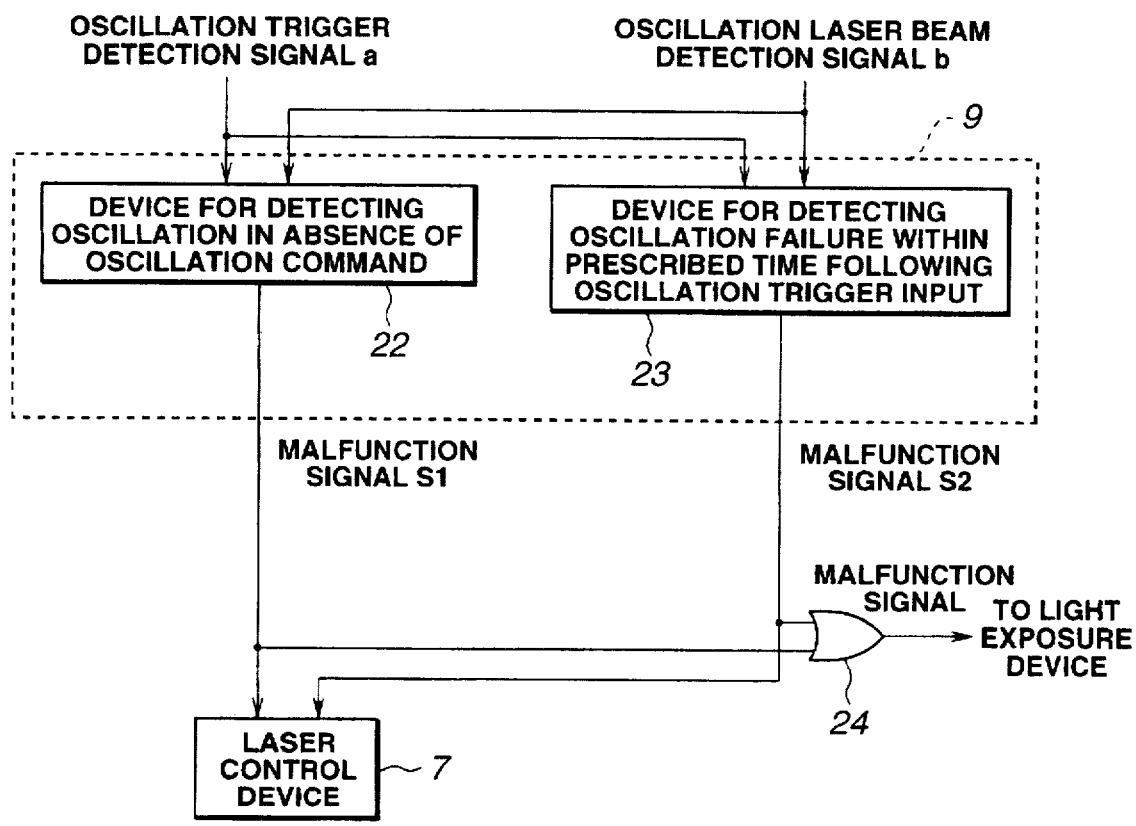
FIG. 3 is a block diagram schematically illustrating the structure of the misfiring detection device depicted in FIG. 1.

FIG. 3 illustrates the basic structure of the misfiring detection device 9.

As shown in the figure, the misfiring detection device 9 comprises a device 22 for detecting a malfunction S1 in which a laser beam L is oscillated when there is no oscillation command a and a device 23 for detecting a malfunction S2 in which a laser beam L is not oscillated within a prescribed permissible time following the input of a oscillation trigger signal a. The oscillation trigger detection signal a and oscillation laser beam detection signal b are input to devices 22 and 23. Based on these detection signals a and b, malfunctions S1 and S2 are detected, and the malfunction detection signals S1 and S2 are output from devices 22 and 23, respectively.

The malfunction detection signals S1 and S2 are input to an OR circuit 24, and the malfunction detection signal S1 or S2 that is output from the OR circuit 24 is added to the light exposure device 12. As a result, the light exposure device 12 allows a prescribed malfunction treatment to be executed based on the malfunction detection signal S1 or S2 that has been input. In terms of the light exposure device 12 having received a malfunction detection signal S1 or S2, for example, a oscillation stop command may be output to the laser control device 7, or light exposure stop control may be executed such as closing of a shutter.

The malfunction detection signals S1 and S2 may also be output directly to the laser control device 7.

The laser control device 7 executes a variety of malfunction processing actions such as stopping laser oscillation based on the malfunction detection signals S1 and S2 that have been input and on signals that are output from the light exposure device 12.

In this embodiment, a thyratron 15 was used as a switching element in the charging circuit 5, but the switching element is [selected] as desired. A solid switch such as a thyristor may also be used, for example.

The concrete structure of the misfiring detection device 9 is described below.

The concrete structure of the malfunction S1 detection device 22 is described first.

Figure 4:
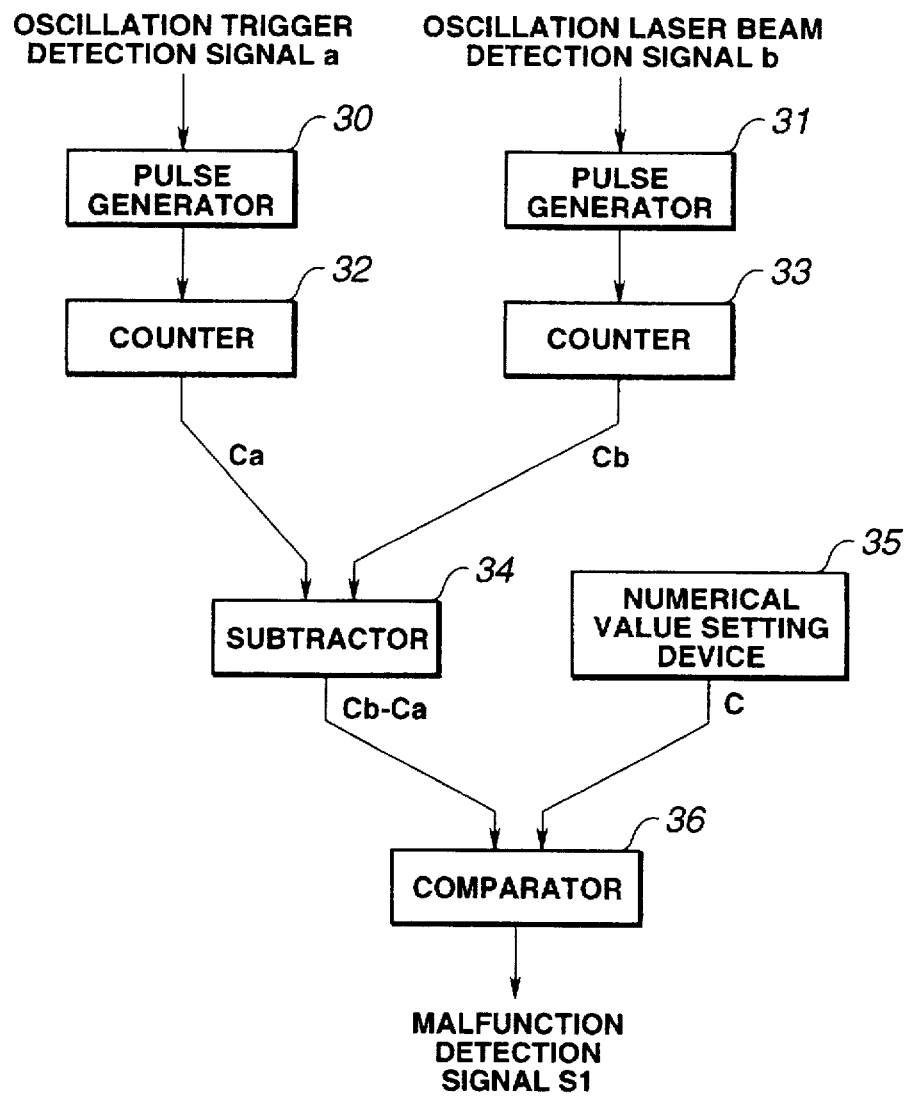
FIG. 4 is a block diagram illustrating the concrete structure of the malfunction S1 detection device depicted in FIG. 3.

FIG. 4 illustrates an example of a case in which the device 22 is constructed with a circuit.

As shown in the figure, the oscillation trigger detection signal a and the oscillation laser beam detection signal b are input to pulse generators 30 and 31, respectively. The input signals a and b are converted and shaped to a prescribed pulse duration by the pulse generators 30 and 31, respectively, and the pulse signals are output to counters 32 and 33, respectively.

The counters 32 and 33 are actuated every time a pulse signal is input, the number of input pulses is counted, and the value of the counted results Ca and Cb are each output to a subtractor 34.

The subtraction Cb−Ca is executed by the subtractor 34, and the subtraction value (number of malfunctions) from Cb−Ca is output to a comparator 36.

The permitted value of misfiring (number of times) C is meanwhile predetermined by a numerical value determining device 35, and this predetermined value C is output to the comparator 36.

The subtraction results from Cb−Ca and the predetermined value C are compared by the comparator 36, and when Cb−Ca≧C, a malfunction detection signal S1 is output.

FIG. 5 illustrates a flow chart for the malfunction detection processing in an embodiment in which a malfunction S1 is detected with software.

Figure 5A:
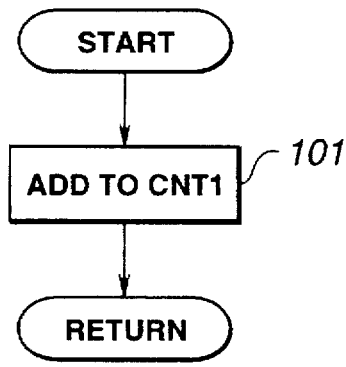
FIGS. 5(a), 5(b), and 5(c) are flow charts illustrating the detection processing procedures executed by the malfunction S1 detection device depicted in FIG. 3.
Figure 5B:
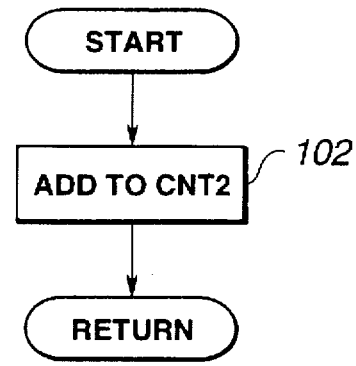

Every time a oscillation trigger detection signal a is input, 1 is sequentially added to CNT1 with the routine depicted in FIG. 5(a) (step 101). Every time a oscillation laser beam detection signal b is input, meanwhile, 1 is sequentially added to CNT2 with the routine depicted in FIG. 5(b) (step 102).

Figure 5C:
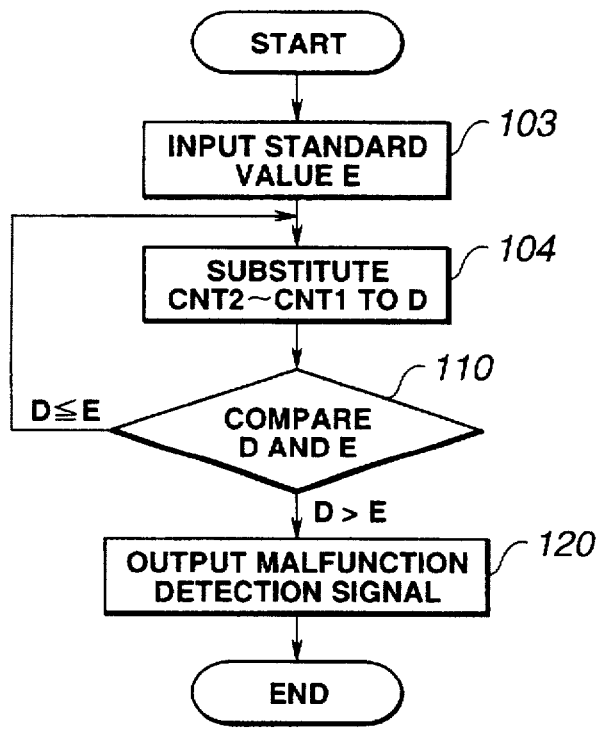

A value (number of times) E serving as a standard for determining malfunctions is then first input with the routine depicted in FIG. 5(c) (step 103). D=CNT2−CNT1 (number of malfunctions) is then calculated (step 104), and the calculated value D and the standard value E are then compared (step 110).

When D≦E, the process returns to step 104. When, on the other hand, D>E, the process then moves on to step 120, and a malfunction detection signal S1 is output (step 120) to conclude the process.

An embodiment in which the malfunction S1 detection device 22 is comprised primarily of a flip-flop circuit is described next. Here, FIG. 6 is a diagram of the circuit structure, and FIGS. 7(a)A to 7(a)F are a timing chart of the signals for the circuit components when a normal determination has been made and a timing chart of the signals for the circuit components when a malfunction determination has been made.

That is, the oscillation laser beam detection signal b and oscillation trigger detection signal a are input to pulse generators 31 and 30, respectively, and shaped into prescribed pulse waveforms A and B (FIGS. 7(a)A to 7(a)F).

The pulse signal A output from the pulse generator 31 is input to the S (set) terminal of the flip-flop 42 and a delay circuit 41.

The pulse signal B output from the pulse generator 30, meanwhile, is input to a delay circuit 40, and the pulse signal B is delayed, is output as a pulse signal C, and is input to the R (reset) terminal of the flip-flop 42.

The flip-flop 42 state signal Q is input as a signal D to one of the input terminals of an AND circuit 43. A pulse signal E delayed by the delay circuit 41, meanwhile, is input to the other input terminal of the AND circuit 43.

An output signal F from the AND circuit 43 is then input to a preset counter 44 that allows an set value (number of times) to be preset. As a result, when the total value (number of malfunctions) of the counter 44 exceeds the set value, a malfunction detection signal S1 is output.

A case in which the laser device 70 is operating normally is described next with reference to FIG. 7(a)A to FIG. (a)F.

The pulse signal A corresponding to a oscillation laser beam detection signal b has a slower timing than the pulse signal B corresponding to a oscillation trigger detection signal a. A pulse C obtained when the pulse B of the oscillation trigger detection signal a is delayed more than the pulse A of the oscillation laser beam detection signal b by the delay circuit 40 is output, and is input to the R (reset) terminal of the flip-flop 42.

During normal operation, the flip-flop 42 is set by the oscillation laser beam detection signal b and is reset by the oscillation trigger detection signal a. The flip-flop 42 state signal Q is thus output as a pulse waveform such as signal D.

Meanwhile, the pulse A of the oscillation laser beam detection signal b is input to the delay circuit 41 and is output as a pulse E that has a greater delay than the pulse waveform D.

Here, the pulses D and E are completely shifted temporally. The AND output F is thus always in a Low state (logical 0 level). As a result, no number of malfunction occurrences is counted by the preset counter 44.

A case in which the laser device 70 is malfunctioning (when a malfunction S1 has occurred) is described next with reference to FIG. 7(b)A to FIG. 7(b)F.

That is, when a laser is oscillated while no oscillation trigger detection signal a has been output, the pulse signal A of a oscillation laser beam detection signal b is input to the flip-flop 42 set terminal S, and the flip-flop 42 output Q is in a High state (signal D).

However, because this is a state in which no reset pulse is input, in short, because the signals B and C are at logical 0 level, the flip-flop 42 output Q is always in a High state (signal D).

The pulse A of the oscillation laser beam detection signal b is delayed by the delay circuit 41 and becomes a waveform E in a High state. As a result, a pulse F in a High state is output from the AND circuit 43 by the input signals D and E. This pulse F is input to the preset counter 44, and the number of malfunctions is counted. As a result, a malfunction detection signal S1 is output when the counted value is greater than the set value.

Another embodiment of a case in which a malfunction S1 is detected with software is described below with reference to the flow chart depicted in FIG. 8.

Figure 8A:
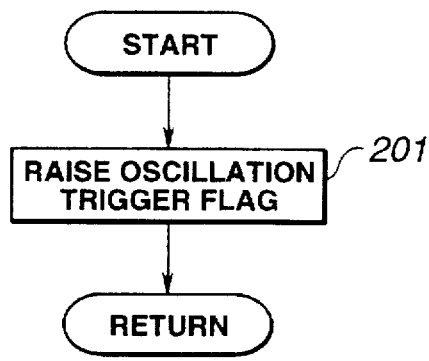
FIGS. 8(a), 8(b), 8(c), and 8(d) are flow charts illustrating the detection processing procedures executed by the malfunctio S1 detection device depicted in FIG. 3.

FIG. 8(a) is a oscillation trigger detection subroutine. Every time a oscillation trigger detection signal a is output, this subroutine is activated and a oscillation trigger flag is raised (step 201).

Figure 8B:
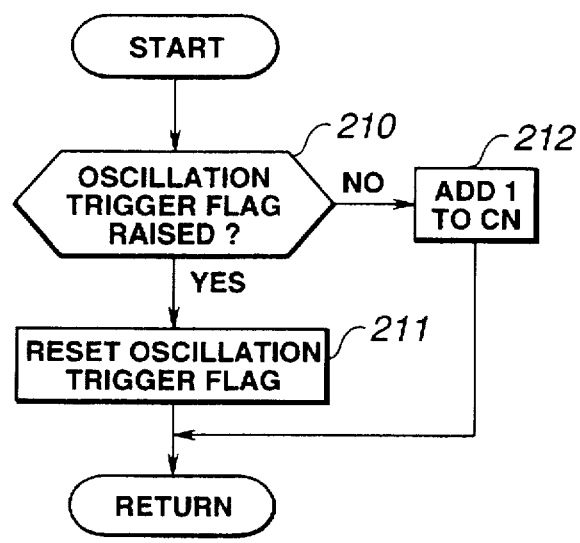

FIG. 8(b) is a laser beam detection subroutine, which is activated every time a oscillation laser beam detection signal b is input.

First, when a laser beam L oscillation is detected, the process moves to step 210, and it is determined whether or not a oscillation trigger flag has already been raised. Here, when a oscillation trigger flag has been raised, the process moves to step 211, and the oscillation trigger flag is reset. When, on the other hand, no oscillation trigger flag has been raised, the process moves to step 212, and 1 is added to CN.

Figure 8C:
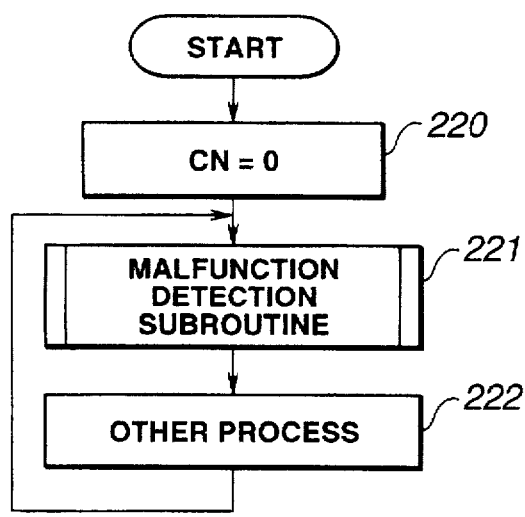

FIG. 8(c) is a main routine. As an initialization process, CN is initialized at 0 (step 220). The malfunction detection subroutine (step 221) and then a process such as a laser oscillation controlling process (step 222) are repeatedly executed.

Figure 8D:
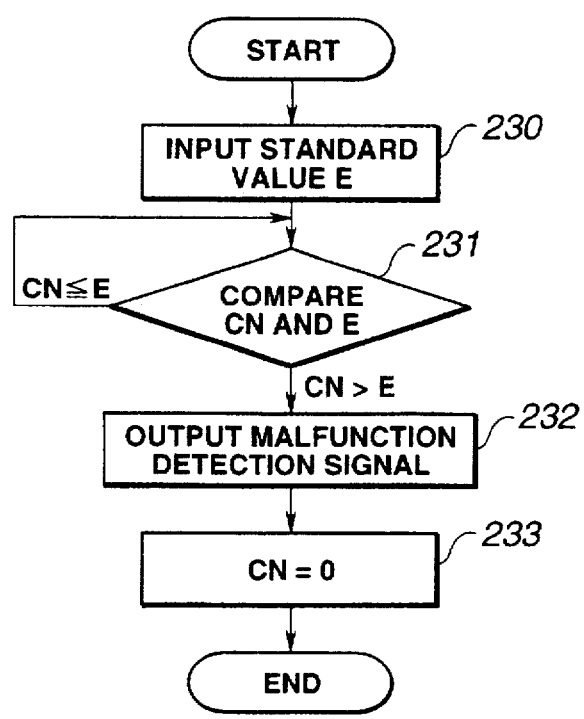

FIG. 8(d) is a malfunction detection subroutine. First, a value (number of times malfunction occurs) E initially serving as a standard for determining malfunctions is input (step 230).

The standard value E is then compared with the current CN (step 231). When CN>E, the number of times malfunction has occurred is greater than the standard value, so the process moves on to step 232. As a result, a malfunction detection signal S1 is output (step 232), CN is reset to 0 (step 233), and the process returns to the main routine.

In this embodiment, the number of times malfunction has occurred E is input in the malfunction detection subroutine (step 230 in FIG. 8(d)). Alternatively, this number may be input in the main routine. In other words, as in step 220 in FIG. 8(c), this process may be added to the initialization process.

Described next is an embodiment in which a device 23 that detects a malfunction S2 in which no laser beam has been oscillated after a prescribed time following input of a oscillation trigger detection signal a is constructed primarily of a flip-flop circuit. Here, FIG. 9 is a diagram of the circuit structure. FIGS. 10(a)A to 10(b)G are timing charts for signals of the circuit components when a normal determination is made and a timing chart of the signals for the circuit components when a malfunction has been determined.

That is, a oscillation trigger detection signal a is input to a generator 30, and a prescribed pulse signal A is generated. The pulse A of this oscillation trigger detection signal a is split into two signal lines, one of which is input to the S (set) terminal of the flip-flop 53, and the other of which is input to a pulse shaper 50.

The pulse signal A is shaped to a prescribed pulse duration by the pulse shaper 50. Here, the length of the pulse duration is set to a length corresponding to the time permitted from the time the trigger pulse signal Tr is generated to the time the laser beam L is oscillated. That is, the pulse duration is the standard value for determining malfunctions. Such a pulse signal C is input to one of the input terminals of the AND circuit 52.

Meanwhile, oscillation laser beam detection signals b are input to the pulse generator 31, and the prescribed pulse signal B is generated. The pulse B of this oscillated laser beam detection signal b is input to the other input terminal of the AND circuit 52.

The output signal D from the AND circuit 52 is input to the R (reset) terminal of the flip-flop 53. Signal E, which is the state signal Q of the flip-flop 53, is then input to one of the input terminals of the AND circuit 54.

The pulse A of the oscillation trigger detection signal a is also input to the delay circuit 51, and the pulse F delayed by the delay circuit 51 is input to the other input terminal of the AND circuit 54.

The output signal G from the AND circuit 54 is input to the preset counter 55, and pulses G in a High state are counted. When the counted value is greater than the set value, a malfunction detection signal S2 is output from the counter 55.

A case in which the laser device 70 is operating normally (when no malfunctions S2 have occurred) is described next with reference to FIGS. 10(a)A to 10(a)G.

That is, the flip-flop 53 is first set by the pulse A of the oscillation trigger detection signal a. Meanwhile, the pulse A is shaped into a pulse C having the aforementioned prescribed pulse duration (permissible time duration) by the pulse shaper 50.

Thus, in the AND circuit 52, the logical product of this pulse C and pulse B of the oscillation laser beam detection signal b is obtained, and when the laser is normally oscillated within the permitted time, a pulse D in a High state (logical 1 level) is output from the AND circuit 52. The flip-flop 53 is then reset by this pulse D.

As a result, a pulse E is generated as an output signal from the flip-flop 53. This pulse E and a pulse F output from the delay circuit 51 do not overlap in time. The output G of the AND circuit 54 is thus always in a Low state (logical 0 level), and the preset counter 55 does not count up the number of malfunctions. The output G from the AND circuit 54 is thus always in a Low state (logical 0 level), and the preset counter 55 counts up no number of malfunctions.

A case in which the laser device 70 is malfunctioning (when a malfunction S2 has occurred) is described next with reference to FIGS. 10(b)A to 10(b)G.

That is, the flip-flop 53 is first set by the pulse A of the oscillation trigger detection signal a. The pulse A is meanwhile shaped into a pulse C having the aforementioned prescribed pulse duration (permitted time duration) by the pulse shaper 50.

When the logical product of this pulse C and the pulse B of the oscillation laser beam detection signal b is obtained by the AND circuit 52, no pulse is generated on the output side of the AND circuit 52 when, for example, the laser is emitted after the permitted time, and the signal is always in a Low state (logical 0 signal D). As a result, the flip-flop 53 is not reset.

The output Q of the flip-flop 53 is thus always in a High state (signal E) and is input to the AND circuit 54. A pulse F, meanwhile, obtained by the delay of the pulse A of the oscillation trigger detection signal a, is input to the AND circuit 52 and is output as such as a pulse G in a High state. This pulse G is input to the preset counter 55, and the number of malfunctions is counted up. As a result, when the number counted is greater than the preset number, a malfunction detection signal S2 is output from the counter 55.

Another embodiment of a malfunction S2 detecting device 23 constructed with a circuit is described below. Here, FIG. 11 is a diagram of the circuit structure. FIGS. 12(a)A to 12(b)E are timing charts of the signals for the circuit components when a normal determination is made and when a malfunction has been determined.

That is, the oscillation trigger detection signal a is input to the pulse generator 30, and the prescribed pulse A is generated. The pulse A of this oscillation trigger detection signal a is input to the pulse shaper 50. The pulse signal A is shaped to the prescribed pulse duration by the pulse shaper 50. Here, the length of the pulse duration is set to a length corresponding to the time permitted from when the trigger pulse signal Tr is generated until the time when the laser beam L is oscillated. In other words, the pulse duration is the standard value for determining malfunctions. Such a pulse signal C is input to an invertor 60. A signal D obtained by conversion of signal C by the invertor 60 is then input to one of the input terminals of the AND circuit 61. The oscillation laser beam detection signal b is meanwhile input to the pulse generator 31, and the prescribed pulse B is generated.

The pulse B of this oscillation laser beam detection signal b is input to the other input terminal of the AND circuit 61. The signal E is output from this AND circuit 61, and this is input to the preset counter 61. The preset counter 62 counts pulses E in a High state (logical 1 level), and when the counted value is greater than the preset number, a malfunction detection signal S2 is output.

A case in which the laser device 70 is operating normally (when no malfunctions S2 have occurred) is described next with reference to FIGS. 12(a)A to 12(a)E.

That is, the pulse A of the oscillation trigger detection signal a is first shaped by the pulse shaper 50 into a pulse C having the aforementioned prescribed pulse duration (permitted time duration). The pulse waveform C is converted into a waveform D by the invertor 60.

The logical product of the converted signal D and the pulse B of the oscillation laser beam detection signal b is obtained by the AND circuit 61, and when light is emitted within the permitted time, the output from the AND circuit 61 is always in a Low state (logical 0 level signal E).

A case in which the laser device 70 is malfunctioning (when a malfunction S2 has occurred) is described next with reference to FIGS. 12(b)A to 12(b)E.

First, the pulse A of the oscillation trigger detection signal a is shaped by the pulse shaper 50 to the aforementioned prescribed pulse duration (permitted time duration). This waveform C is converted by the invertor 60 and is output as a waveform D. Here, when the pulse B of the oscillation laser beam detection signal b is generated after the permitted time, a pulse B with a logical 1 level is output from the AND circuit 61 as a pulse E.

This pulse E is counted up by the preset counter 62. As a result, a malfunction detection signal S2 is output from the counter 62 when the counted number is greater than the set number of times.

An embodiment of a case in which a malfunction S2 is detected with software is described next with reference to the timing charts shown in FIG. 13.

Figure 13A:
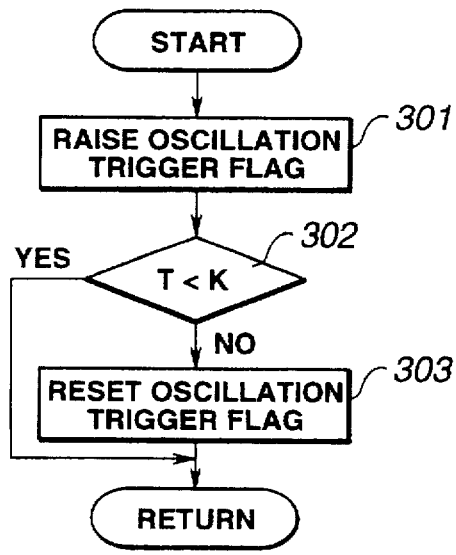
FIGS. 13(a), 13(b), 13(c) and 13(d) are flow charts illustrating the detection processing procedures executed by the malfunction S2 detection device depicted in FIG. 3.

FIG. 13(a) is a oscillation trigger detection subroutine. Every time a oscillation trigger detection signal a is input, this subroutine is activated, and a oscillation trigger flag is raised (step 301). The time T following the input of the oscillation trigger detection signal a is counted, and it is determined whether or not this time T is less than the prescribed set time K (step 302). Here, when the time T is at or beyond the set time K, the oscillation trigger flag is reset (step 303) and the process starts over. When the time T is less than the set time K, the process is started over with the oscillation trigger flag still raised.

Figure 13B:
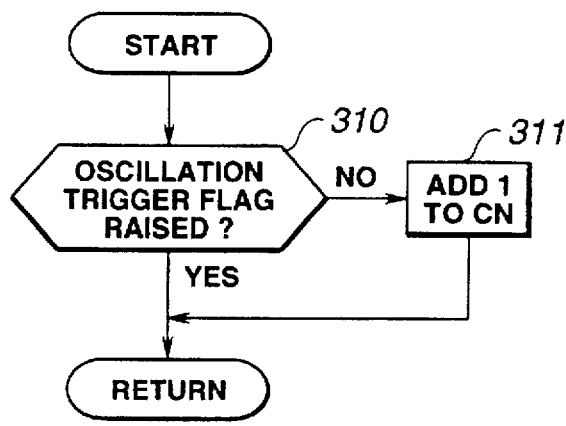

FIG. 13(b) is a laser beam detection subroutine and is activated every time a oscillation laser beam detection signal b is input.

First, when a laser beam L oscillation is detected, the process moves to step 310, and it is determined whether or not a oscillation trigger flag has already been raised. Here, when a oscillation trigger flag has been raised, the process starts over, but when no oscillation trigger flag has been raised, 1 is added to CN (step 311).

Figure 13C:
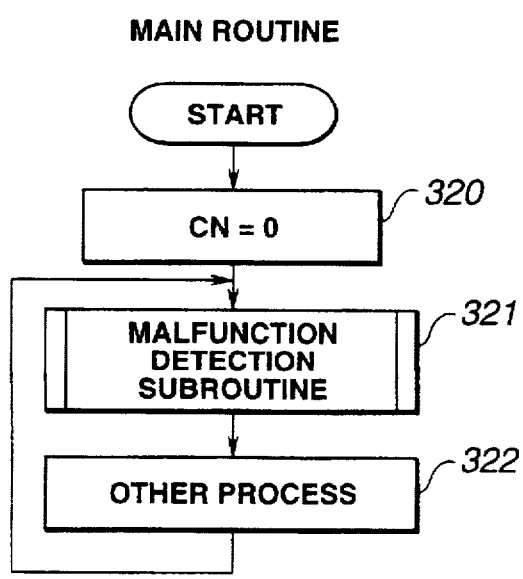

FIG. 13(c) is a main routine. As an initialization process, CN is initialized at 0 (step 320). The malfunction detection subroutine (step 321) and then a process such as laser oscillation control (step 322) are repeatedly executed.

Figure 13D:
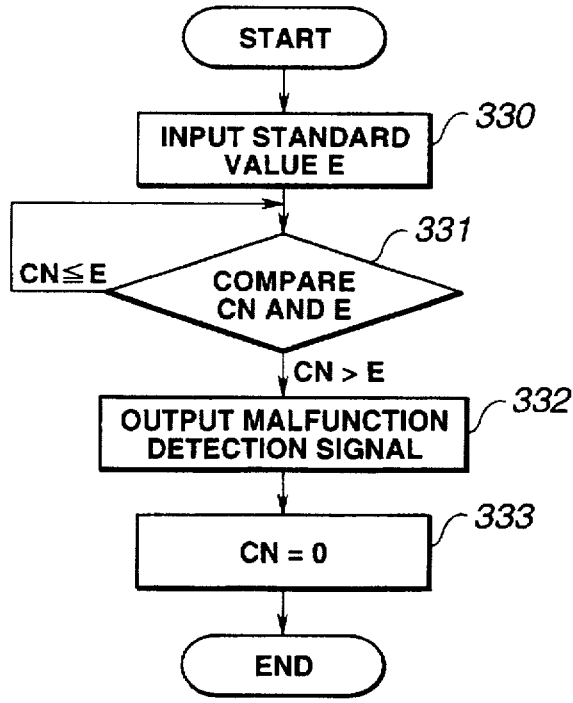

FIG. 13(d) is a malfunction detection subroutine. A value (number of times malfunctions occur) E serving as a standard for initially determining a malfunction is first input (step 330).

The current CN is then compared with the standard value E (step 331). When CN>E, the number of times a malfunction has occurred is greater than the standard value, so the process moves on to step 332. As a result, a malfunction detection signal S1 is output (step 332), CN is reset to 0 (step 333), and the process is returned to the main routine.

Figure 14:
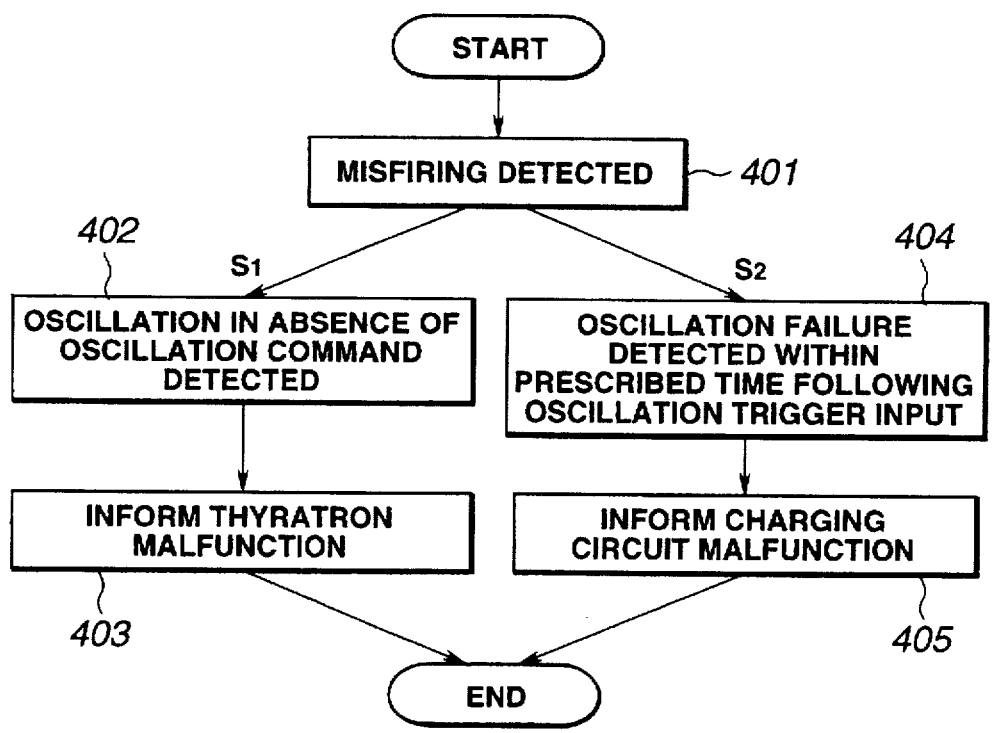
FIG. 14 is a flow chart illustrating the processing procedures for diagnosing troubles in laser devices.

An embodiment in which trouble in the laser device 70 is diagnosed is described next with reference to FIG. 14.

With this trouble diagnosis routine, misfiring in the laser device 70 is first detected by the misfiring detection device 9 depicted in FIG. 3 (step 401). As a result, a malfunction detection signal S1 or malfunction detection signal S2 is output.

When a malfunction detection signal S1 is output, a laser beam has been oscillated in the absence of a laser oscillation command (step 402). It is determined that the malfunction is caused by the self-destruct of the thyratron 15 which is the switching element depicted in FIG. 2, that is, by switching in the absence of a trigger pulse signal Tr input, the trouble location is specified as "malfunction in thyratron 15," and a message to that effect is communicated outside the laser device 70 (step 403). This allows measures such as repair or exchange of the thyratron 15 to be promptly undertaken.

When, on the other hand, a malfunction detection signal S2 is output, a laser beam has not been oscillated after a prescribed permissible time following output of a trigger pulse Tr (step 404). It is then determined that this kind of malfunction is caused by a malfunction in the charging circuit 5 depicted in FIG. 2, the trouble location is specified as "malfunction in charging circuit 5," and a message to that effect is communicated outside the laser device 70 (step 405). This allows measures such as inspection of the charging circuit 5 to be promptly undertaken.

As described above, the present invention allows the production of defective products to be forestalled because the present invention allows malfunctions that prove to be problems in the scan method to be detected in advance.

When a malfunction has occurred, the trouble location in the laser device can be rapidly specified, allowing operations to be promptly resumed and operational efficiency to be dramatically improved.

What is claimed is:

1. A device for detecting malfunctions in a laser device in which a laser beam is oscillated in response to a laser oscillation command, comprising:

laser oscillation command detection means for detecting laser oscillation commands;

laser oscillation detection means for detecting a presence or absence of oscillation of a laser beam; and means for outputting a malfunction signal indicating that the laser device is malfunctioning in the event that a laser beam oscillation is detected by the laser oscillation detection means when no laser oscillation command has been detected by the laser oscillation command detection means.

2. A device for detecting malfunctions in a laser device having a charging circuit in which a laser beam is oscillated in response to a laser oscillation command, comprising:

laser oscillation command detection means for detecting laser oscillation commands;

laser oscillation detection means for detecting a presence or absence of oscillation of a laser beam; and means for outputting a malfunction signal indicating that the charging circuit of the laser device is malfunctioning when no laser bean oscillation is detected by the laser oscillation detection means at a prescribed point in time after a laser oscillation command given to the charging circuit has been detected by the laser oscillation command detection means.

3. A device for detecting malfunctions in a laser device in which a laser beam is oscillated in response to a laser oscillation command, comprising:

laser oscillation command detection means for detecting laser oscillation commands;

laser oscillation detection means for detecting a presence or absence of oscillation of a laser beam;

first malfunction detection means for outputting a first malfunction signal indicating that the laser device is malfunctioning in the event that a laser beam oscillation is detected by the laser oscillation detection means when no laser oscillation command has been detected by the laser oscillation command detection means;

second malfunction detection means for outputting a second malfunction signal indicating that the laser device is malfunctioning when no laser beam oscillation is detected by the laser oscillation detection means at a prescribed point in time after a laser oscillation command has been detected by the laser oscillation command detection means; and trouble location determination means for determining a location of trouble in the laser device based on detection results of the first and second malfunction detection means.

4. A device for detecting malfunctions in a laser device having a pulse oscillation laser unit for performing laser pulse oscillation in response to a laser oscillation command; and a light exposure unit in which light exposure is carried out to an object to be exposed by irradiating a pulse laser beam oscillated by the pulse oscillation laser unit, wherein the pulse laser beam is irradiated onto each portion of the object to be exposed by moving the object in synchronism with the laser pulse oscillation performed in the pulse oscillation laser unit, comprising:

laser oscillation command detection means for detecting laser oscillation commands;

laser oscillation detection means for detecting a presence or absence of oscillation of a laser beam; and means for outputting a malfunction signal indicating that the laser device is malfunctioning when no laser beam oscillation is detected by the laser oscillation detection means at a prescribed point in time after a laser oscillation command has been detected by the laser oscillation command detection means.

* * * * *